US008619827B2

(12) United States Patent
Maeda et al.

(10) Patent No.: US 8,619,827 B2
(45) Date of Patent: Dec. 31, 2013

(54) CORRECTION CIRCUIT, DRIVE CIRCUIT, LIGHT EMITTING DEVICE, AND METHOD OF CORRECTING CURRENT PULSE WAVEFORM

(75) Inventors: Osamu Maeda, Kanagawa (JP); Katsuhisa Daio, Kagoshima (JP); Koichi Kobe, Kanagawa (JP); Takehiro Taniguchi, Tokyo (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 171 days.

(21) Appl. No.: 12/805,874

(22) Filed: Aug. 23, 2010

(65) Prior Publication Data

US 2011/0075691 A1 Mar. 31, 2011

(30) Foreign Application Priority Data

Sep. 25, 2009 (JP) ................................. 2009-221255

(51) Int. Cl.
*H01S 3/00* (2006.01)
(52) U.S. Cl.
USPC .................. 372/38.07; 372/29.015; 372/38.02
(58) Field of Classification Search
USPC ................................ 372/29.015, 38.02, 38.07
See application file for complete search history.

(56) References Cited

U.S. PATENT DOCUMENTS

| 4,835,780 A * | 5/1989 | Sugimura et al. ........... 372/29.01 |
| 4,888,777 A * | 12/1989 | Takeyama ................... 372/29.01 |
| 5,465,264 A * | 11/1995 | Buhler et al. ................... 372/31 |
| 2002/0181520 A1* | 12/2002 | Iguchi et al. ............... 372/38.02 |
| 2006/0146894 A1* | 7/2006 | Shin .......................... 372/29.015 |
| 2007/0285491 A1* | 12/2007 | Kishimoto ..................... 347/233 |
| 2008/0225106 A1* | 9/2008 | Omori et al. .................. 347/237 |
| 2009/0135876 A1* | 5/2009 | Takeuchi et al. ........... 372/50.11 |
| 2011/0241571 A1* | 10/2011 | Maeda et al. ................. 315/307 |
| 2012/0250713 A1* | 10/2012 | Maeda et al. ............. 372/38.02 |

FOREIGN PATENT DOCUMENTS

| JP | 63-144653 | 6/1988 |
| JP | 2008-113051 A | 5/2008 |
| JP | 2008-306118 A | 12/2008 |

OTHER PUBLICATIONS

Takahiro Emoto et al., "A Study on Gigabit Laser Driver Circuit with RC Shunt Circuit for LD Current Waveform Correction," Jul. 29-31, 2008, International Conference on Advanced Infocomm Technology'08.*

"Light Exposure System Using a Vertical-Cavity Surface-Emitting Laser Diode Array," Fuji Xerox Technical Report No. 16 2006, pp. 11-19.

* cited by examiner

*Primary Examiner* — Jessica Stultz
*Assistant Examiner* — Joshua King
(74) *Attorney, Agent, or Firm* — Rader, Fishman & Grauer PLLC (57) ABSTRACT

A correction circuit is provided, which may reduce dullness of a light output waveform due to wavelength detuning. The correction circuit includes an RC time constant circuit. The RC time constant circuit is used to correct a waveform of a current pulse outputted from a current source, the current source driving a surface-emitting semiconductor laser in a pulsed manner, so that a pulse waveform of light output of the semiconductor laser is approximately a rectangle.

18 Claims, 8 Drawing Sheets

CORRECTION CIRCUIT, DRIVE CIRCUIT, LIGHT EMITTING DEVICE, AND METHOD OF CORRECTING CURRENT PULSE WAVEFORM

BACKGROUND OF THE INVENTION

1. Field of the Invention

The present invention relates to a correction circuit correcting a current pulse waveform applied to a surface-emitting semiconductor laser that emits laser light from a top thereof, and relates to a drive circuit and a light emitting device each having the correction circuit. In addition, the invention relates to a method of correcting the current pulse waveform applied to the semiconductor laser.

2. Description of Related Art

The surface-emitting semiconductor laser, which emits light in a direction perpendicular to a substrate unlike a Fabry-Perot cavity laser in the past, may have many resonator structures arranged in a two-dimensional array on the same substrate. Therefore, the surface-emitting semiconductor laser is recently noticed in various technical fields of data communication, printers and the like.

The surface-emitting semiconductor laser typically includes a mesa resonator structure formed by stacking a lower DBR layer, a lower spacer layer, an active layer, an upper spacer layer, a current narrowing layer, an upper DBR layer, and a contact layer in this order on a substrate. In such a semiconductor laser, an oscillation wavelength is determined by an effective resonator length of the resonator structure, and magnitude of light output is maximized at an emission wavelength corresponding to a band gap of the active layer. Therefore, the resonator structure and the active layer are typically configured such that the effective resonator length of the resonator structure is equal to the emission wavelength of the active layer (see Japanese Patent Application, Publication No. 2008-306118).

SUMMARY OF THE INVENTION

Figure 11:
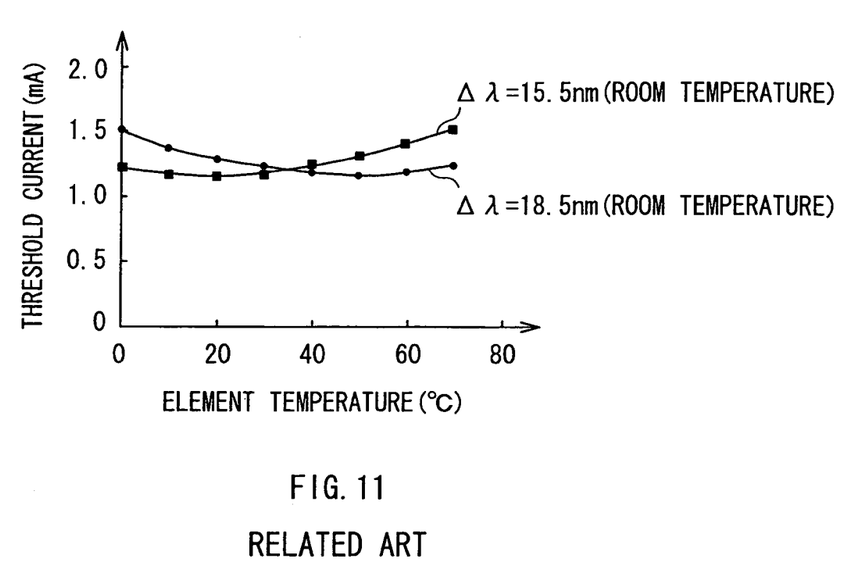
FIG. 11 is a graph showing an example of a relationship between wavelength detuning and element temperature at which a threshold current is minimized.

In the surface-emitting semiconductor laser, change in element temperature causes change in difference (wavelength detuning $\Delta\lambda$) between the effective resonator length of the resonator structure and the emission wavelength of the active layer, and a threshold current varies in correspondence to magnitude of the wavelength detuning $\Delta\lambda$. For example, change in element temperature causes change in threshold current as shown in FIG. 11. In addition, as shown in FIG. 11, the threshold current is minimized at a high element temperature in the case of large wavelength detuning $\Delta\lambda$ ($\Delta\lambda=18.5$ nm) compared with the case of small wavelength detuning $\Delta\lambda$ ($\Delta\lambda=15.5$ nm). Therefore, the wavelength detuning $\Delta\lambda$ is preferably increased so as to reduce the threshold current in a red or infrared surface-emitting semiconductor laser of which the high-temperature, high-output operation is not easy.

Figure 12:
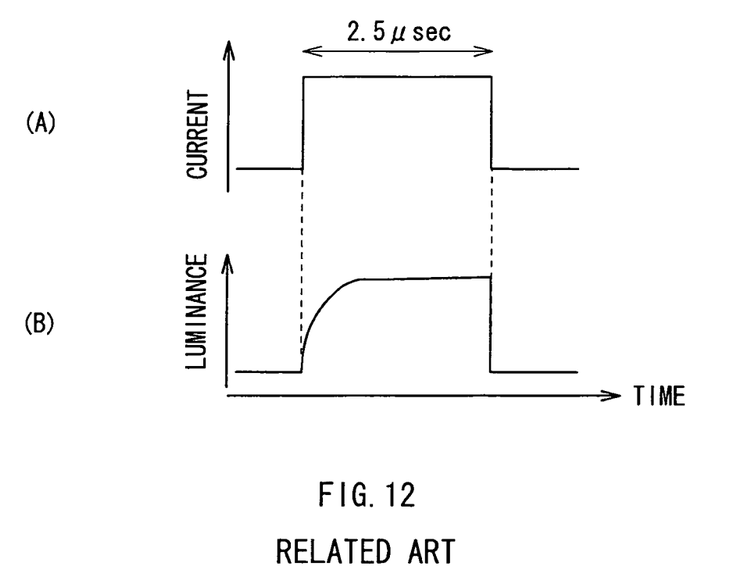
FIG. 12 is a diagram showing an example of a current pulse waveform and an example of a light-output pulse waveform.

However, when the wavelength detuning $\Delta\lambda$ is increased, another difficulty has occurred. For example, when the red or infrared surface-emitting semiconductor laser is pulse-driven while the wavelength detuning $\Delta\lambda$ is increased, a light output waveform becomes dull compared with a current pulse waveform as shown in FIG. 12.

It is desirable to provide a correction circuit that may reduce dullness of a light output waveform due to wavelength detuning $\Delta\lambda$, and a drive circuit and a light emitting device each having the correction circuit. It is further desirable to provide a method of correcting a current pulse waveform, the method being able to reduce dullness of a light output waveform due to wavelength detuning $\Delta\lambda$.

A correction circuit according to an embodiment of the invention includes an RC time constant circuit. In the correction circuit, the RC time constant circuit is used to correct a waveform of a current pulse outputted from a current source, the current source driving a surface-emitting semiconductor laser in a pulsed manner, so that a pulse waveform of light output of the surface-emitting semiconductor laser is approximately a rectangle.

A drive circuit according to an embodiment of the invention includes a current source driving a surface-emitting semiconductor laser in a pulsed manner, and the correction circuit. A light emitting device according to an embodiment of the invention includes one or multiple surface-emitting semiconductor lasers, and a current source driving the semiconductor laser in a pulsed manner, and the correction circuit.

A method of correcting a current pulse waveform according to an embodiment of the invention includes a step of using a correction circuit including an RC time constant circuit to correct a waveform of a current pulse outputted from a current source, the current source driving a surface-emitting semiconductor laser in a pulsed manner, so that a pulse waveform of light output of the semiconductor laser is approximately a rectangle.

In the correction circuit, the drive circuit, the light emitting device, and the method of correcting a current pulse waveform of the embodiment of the invention, the correction circuit including the RC time constant circuit is used to correct a waveform of a current pulse outputted from a current source, the current source driving a surface-emitting semiconductor laser in a pulsed manner, so that a pulse waveform of light output of the semiconductor laser is approximately a rectangle. In this way, the RC time constant circuit is used, thereby the current pulse waveform may be shaped to be approximately a rectangle not only in a gradually sloped region after rising of a pulse, but also in an abruptly curved region during rising of a pulse.

According to the correction circuit, the drive circuit, the light emitting device, and the method of correcting a current pulse waveform of the embodiment of the invention, the RC time constant circuit is used, thereby the current pulse waveform may be shaped to be approximately a rectangle not only in a gradually sloped region after rising of a pulse, but also in an abruptly curved region during rising of a pulse. Thus, dullness of a light output waveform due to wavelength detuning $\Delta\lambda$ may be reduced.

Other and further objects, features and advantages of the invention will appear more fully from the following description.

BRIEF DESCRIPTION OF THE DRAWINGS

FIGS. 8A to 8C are diagrams, where

DETAILED DESCRIPTION OF THE PREFERRED EMBODIMENTS

Hereinafter, a preferred embodiment of the invention will be described in detail with reference to drawings. Description is made in the following sequence.

1. Configuration
2. Operation
3. Principle
4. Advantages

Configuration

Figure 1:
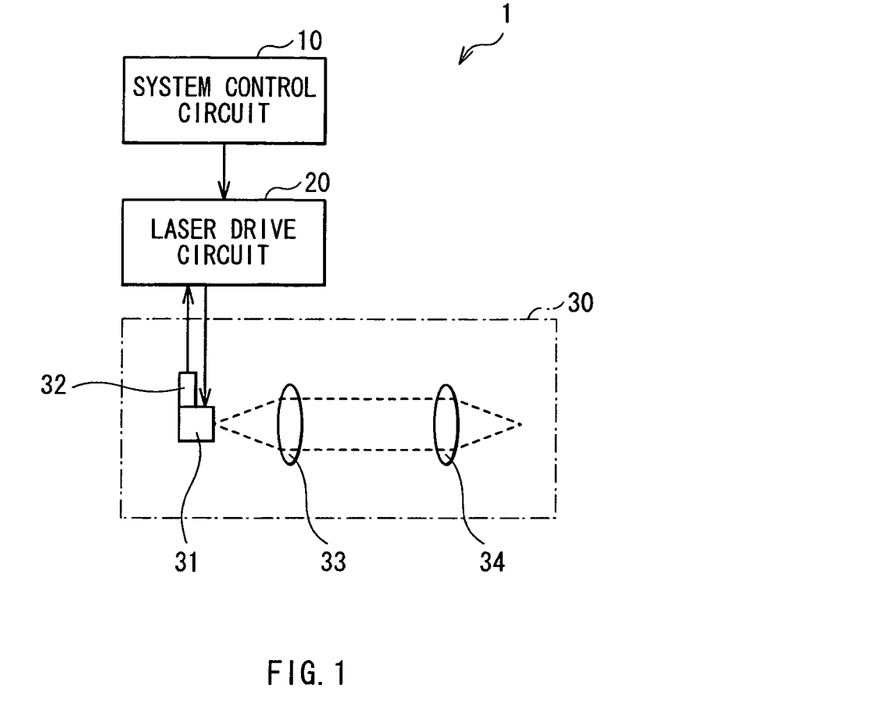
FIG. 1 is a diagram showing a schematic configuration of a light emitting device according to an embodiment of the invention.

FIG. 1 shows an example of a schematic configuration of a light emitting device 1 according to an embodiment of the invention. The light emitting device 1 includes, for example, a system control circuit 10, a laser drive circuit 20, and an optical system 30 as shown in FIG. 1.

The system control circuit 10 controls drive of a semiconductor laser device 31 via the laser drive circuit 20.

Figure 6:
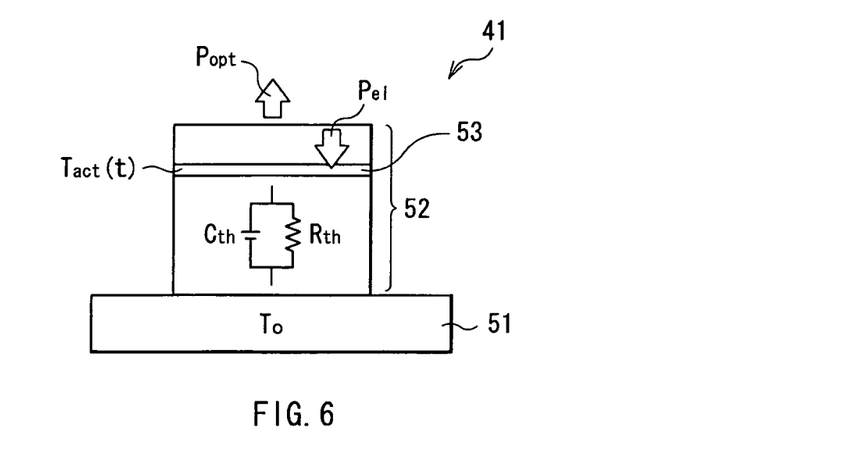
FIG. 6 is a diagram showing an example of a schematic configuration of the semiconductor laser device in FIG. 1 and an example of a thermal circuit of the semiconductor laser device.

The optical system 30 includes, for example, the semiconductor laser device 31, a thermistor 32, a collimating lens 33, and an objective lens 34. The semiconductor laser device 31 includes one or multiple surface-emitting semiconductor laser (not shown). The surface-emitting semiconductor laser (hereinafter, simply called semiconductor laser) in the semiconductor laser device 31 includes, for example, a laser structure 52 on a substrate 51 as shown in FIG. 6. The laser structure 52 has a vertical resonator structure including an active layer 53 sandwiched by a pair of multilayer reflectors (not shown), and thus emits laser light from a top of the structure. The active layer 53 includes, for example, a red material (GaInP, AlGaInP or the like). In this case, wavelength detuning $\Delta\lambda$ as a difference between an emission wavelength of the active layer 53 and an oscillation wavelength of the surface-emitting semiconductor laser is 15 nm or more. The active layer 53 may include another material, for example, an infrared material (GaAs, AlGaAs or the like). In this case, the wavelength detuning $\Delta\lambda$ is 13 nm or more.

The thermistor 32 senses (measures) temperature of the semiconductor laser. A resistance value of the thermistor 32 varies depending on temperature of the semiconductor laser. Thus, temperature of the semiconductor laser may be sensed by reading the resistance value of the thermistor 32. The collimating lens 33 is an optical element that shapes laser light emitted from the semiconductor laser device 31 into parallel light. The objective lens 34 is an optical element that collects the laser light shaped into parallel light by the collimating lens 33 while irradiating the collected laser light to a not-shown irradiated object.

Figure 2:
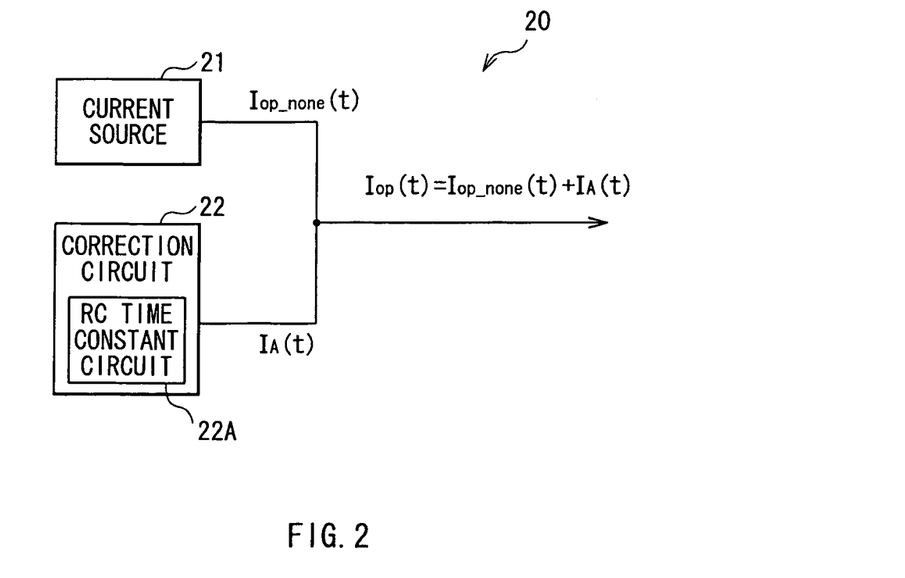
FIG. 2 is a diagram showing an example of an internal configuration of a laser drive circuit in FIG. 1.

The laser drive circuit 20 injects a current into the semiconductor laser to induce light emission of the semiconductor laser. The laser drive circuit 20 has, for example, a current source 21 and a correction circuit 22 as shown in FIG. 2.

Figure 3A:
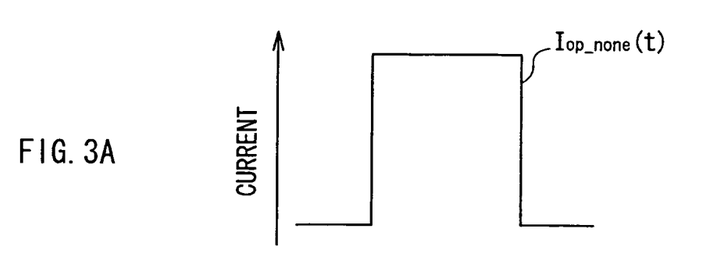
FIGS. 3A to 3C are diagrams showing an example of current pulse waveforms generated by the laser drive circuit in FIG. 1.

The current source 21 is to drive the semiconductor laser in a pulsed manner, and, for example, outputs a rectangular current pulse (current $I_{op-none}(t)$) as shown in FIG. 3A. The correction circuit 22 has an RC time constant circuit 22A which is used to correct a waveform of the current pulse outputted from the current source 21 so that a pulse waveform of light output of the semiconductor laser is approximately a rectangle.

Figure 3B:
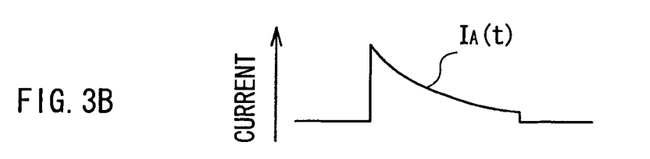
Figure 3C:
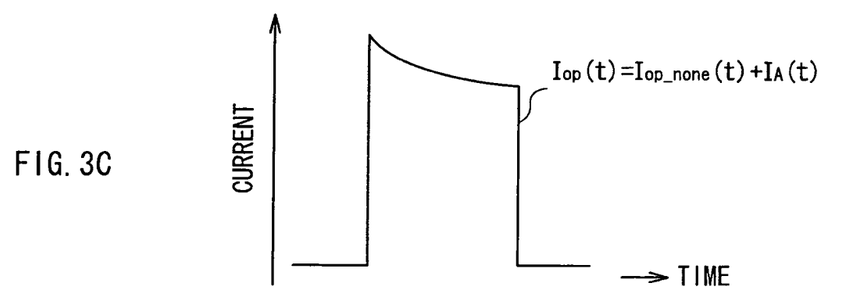

The RC time constant circuit 22A includes a plurality of first time constant circuits (not shown) that attenuate a crest value of the current pulse (current $I_{op-none}(t)$) outputted from the current source 21 with time. The first time constant circuits have RC time constants different from one another. Specifically, at least one second time constant circuit (not shown) of the first time constant circuits has an RC time constant having a value within a range of 20 to 50 nsec both inclusive. One or multiple third time constant circuit (not shown) other than the second time constant circuit of the first time constant circuits has an RC time constant having a value more than 50 nsec (typically 300 to 1500 nsec both inclusive). The correction circuit 22 uses the first time constant circuits to correct the crest value of the current pulse outputted from the current source 21 so that the crest value is attenuated with time in accordance with an RC time constant of the RC time constant circuit. For example, the correction circuit 22 uses the first time constant circuits to output a current pulse (current $I_A(t)$), of which the crest value is attenuated with time, as shown in FIG. 3B.

For example, the RC time constant circuit 22A includes two, first time constant circuits, and one of the first time constant circuits (second time constant circuit) has an RC time constant $T_{A1}$ having a value within a range of 20 to 50 nsec both inclusive, and the other of the first time constant circuits (third time constant circuit) has an RC time constant $T_{A2}$ having a value more than 50 nsec (typically 300 to 1500 nsec both inclusive). In this case, the correction circuit 22 outputs an assist current $I_A(t)$ as shown in the following numerical expression 1.

$$I_A(t) = \left(\frac{V_A}{\kappa}\right) \cdot g(t) \quad \text{[Numerical expression 1]}$$

In the numerical expression, $\kappa$ is a constant for converting an assist current factor $V_A$ into a current value. The assist current factor $V_A$ is expressed by the following numerical expression 2. Furthermore, $g(t)$ in the numerical expression 1 is expressed by the following numerical expression 3, and defines a degree of attenuating the crest value of the current pulse (current $I_{op-none}(t)$) outputted from the current source 21 with time.

[Numerical expression 2]
$$V_A = V_{offset} + V_{iop} - V_{ib} - V_0$$

[Numerical expression 3]
$$g(t) = v \cdot \exp\left[-\frac{t}{T_{A1}}\right] + (1-v) \cdot \exp\left[-\frac{t}{T_{A2}}\right]$$

In the numerical expression 3, ν denotes a weighting factor for a term of the RC time constant $T_{A1}$, and has a value larger than 0.5 because the RC time constant $T_{A1}$ is dominant in the assist current $I_A(t)$.

The assist current factor $V_A$ in the numerical expression 1 includes a factor $V_0$ determining element temperature $T_0$ (ambient temperature), a factor $V_{ib}$ determining bias current, and a factor $V_{iOP}$ determining operation current. That is, the correction circuit 22 changes the crest value of the current pulse outputted from the current source 21 in accordance with the factor $V_0$ determining the element temperature $T_0$ (ambient temperature), the factor $V_{ib}$ determining the bias current, and the factor $V_{iOP}$ determining the operation current.

Figure 4:
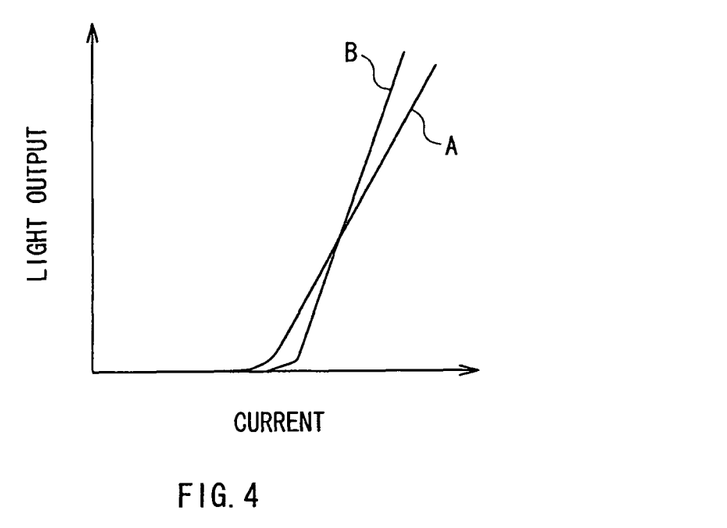
FIG. 4 is a diagram showing an example of an I-L characteristic of a semiconductor laser device in FIG. 1.

The assist current factor $V_A$ in the numerical expression 1 further includes offset voltage $V_{offset}$. The offset voltage $V_{offset}$ is to compensate variation in magnitude of the assist current $I_A(t)$ to be necessary, the variation being possibly caused by variation in I-L characteristic as shown in A and B in FIG. 4 due to variation in wavelength detuning $\Delta\lambda$ as a difference between an emission wavelength of the active layer 53 and an oscillation wavelength of the semiconductor laser. Therefore, the correction circuit 22 may adjust a value of the offset voltage $V_{offset}$ to change the crest value of the current pulse outputted from the current source 21 in accordance with magnitude of the wavelength detuning $\Delta\lambda$.

The numerical expression 1 includes the constant κ. Therefore, the correction circuit 22 may adjust a value of the constant κ for converting the assist current factor $V_A$ into a current value to change the crest value of the current pulse outputted from the current source 21.

In the case that the current source 21 continuously outputs current pulses, the RC time constant circuit 22A further includes a plurality of fourth time constant circuits (not shown) that adjust a crest value of a current pulse outputted from the current source 21. When the current source 21 outputs the current pulses for light emission of the semiconductor laser, the fourth time constant circuits are used to correct the waveform in consideration of a remaining heat factor in the semiconductor laser (in the active layer 53). Thus, the correction circuit 22 may use the fourth time constant circuits to correct the crest value of the current pulse outputted from the current source 21 so that the crest value varies in correspondence to variation in temperature of the active layer 53.

The fourth time constant circuits have RC time constants different from one another. Specifically, at least one fifth time constant circuit (not shown) of the fourth time constant circuits has an RC time constant $T_{th1}$ having a value within a range of 20 to 50 nsec both inclusive. One or multiple sixth time constant circuit (not shown) other than the fifth time constant circuit of the fourth time constant circuits has an RC time constant $T_{th2}$ having a value more than 50 nsec (typically 300 to 1500 nsec both inclusive).

For example, the RC time constant circuit 22A includes two, fourth time constant circuits, and one of the fourth time constant circuits (fifth time constant circuit) has an RC time constant $T_{th1}$ having a value within a range of 20 to 50 nsec both inclusive, and the other of the fourth time constant circuits (sixth time constant circuit) has an RC time constant $T_{th1}$ having a value more than 50 nsec (typically 300 to 1500 nsec both inclusive). In this case, the correction circuit 22 outputs an assist current $I_A(t)$ as shown in the following numerical expression 4.

$$I_A(t) = I_{max}(t) \cdot g(t) \quad \text{[Numerical expression 4]}$$

$I_{max}(t)$ in the numerical expression 4 is expressed by the following numerical expression 5, and defines a maximum value of the assist current $I_A(t)$. A function f(t) in the numerical expression 5 is expressed by the following numerical expression 6, and represents variation in waveform in correspondence to variation in remaining heat factor in the semiconductor laser (in the active layer 53). Consequently, the correction circuit 22 may accurately correct the waveform as if the circuit monitors variation in temperature of the active layer 53 in realtime.

$$I_{max}(t) = \left(\frac{V_A}{\kappa}\right) \cdot (1 - f(t)) \quad \text{[Numerical expression 5]}$$

$$\left.\begin{array}{l} \text{On period} \\ u \cdot \left[1 - \exp\left(-\frac{t}{T_{th1}}\right)\right] + \\ (1-u) \cdot \left[1 - \exp\left(-\frac{t}{T_{th2}}\right)\right] \\ \text{Off period} \\ u \cdot \exp\left(-\frac{t}{T_{th1}}\right) + (1-u) \cdot \exp\left(-\frac{t}{T_{th2}}\right) \end{array}\right\} \equiv f(t) \quad \text{[Numerical expression 6]}$$

In the numerical expression 6, u denotes a weighting factor for a term of the RC time constant $T_{th1}$, and has a value larger than 0.5 because the RC time constant $T_{th1}$ is dominant in the assist current $I_A(t)$. In the expression 6, t in the left side of the expression denotes a start point of an on or off period when the semiconductor laser is operated by on/off drive.

Figure 5A:
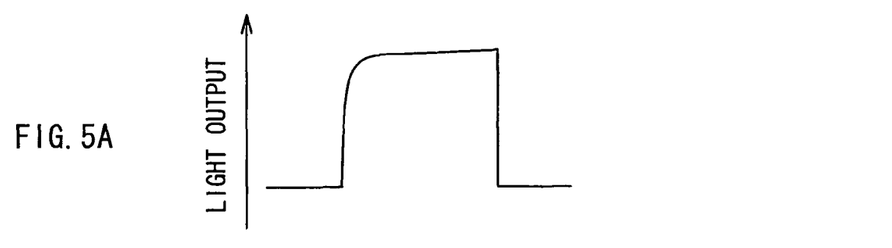
FIGS. 5A and 5B are diagrams showing an example of light output waveforms of the semiconductor laser device in FIG. 1.
Figure 5B:
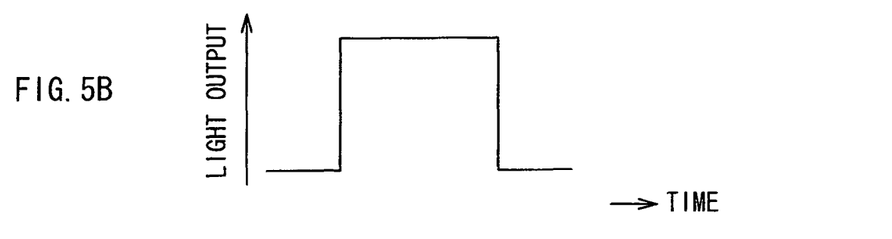

In the laser drive circuit 20, for example, an output terminal of the current source 21 is connected to an output terminal of the correction circuit 22 as shown in FIG. 2. Therefore, the laser drive circuit 20 outputs a current pulse ($I_{op}(t) = I_{op\text{-}none}(t) + I_A(t)$) formed by superposing output of the current source 21 on output of the correction circuit 22. Thus, for example, in the case that only output of the current source 21 is applied to the semiconductor laser, and a pulse waveform of light output of the semiconductor laser becomes dull compared with a waveform of a current pulse outputted from the current source 21 as shown in FIG. 5A, the current pulse formed by superposing output of the current source 21 on output of the correction circuit 22 is applied to the semiconductor laser, thereby the pulse waveform of light output of the semiconductor laser may be shaped to be approximately a rectangle, for example, as shown in FIG. 5B.

Operation

Figure 10:
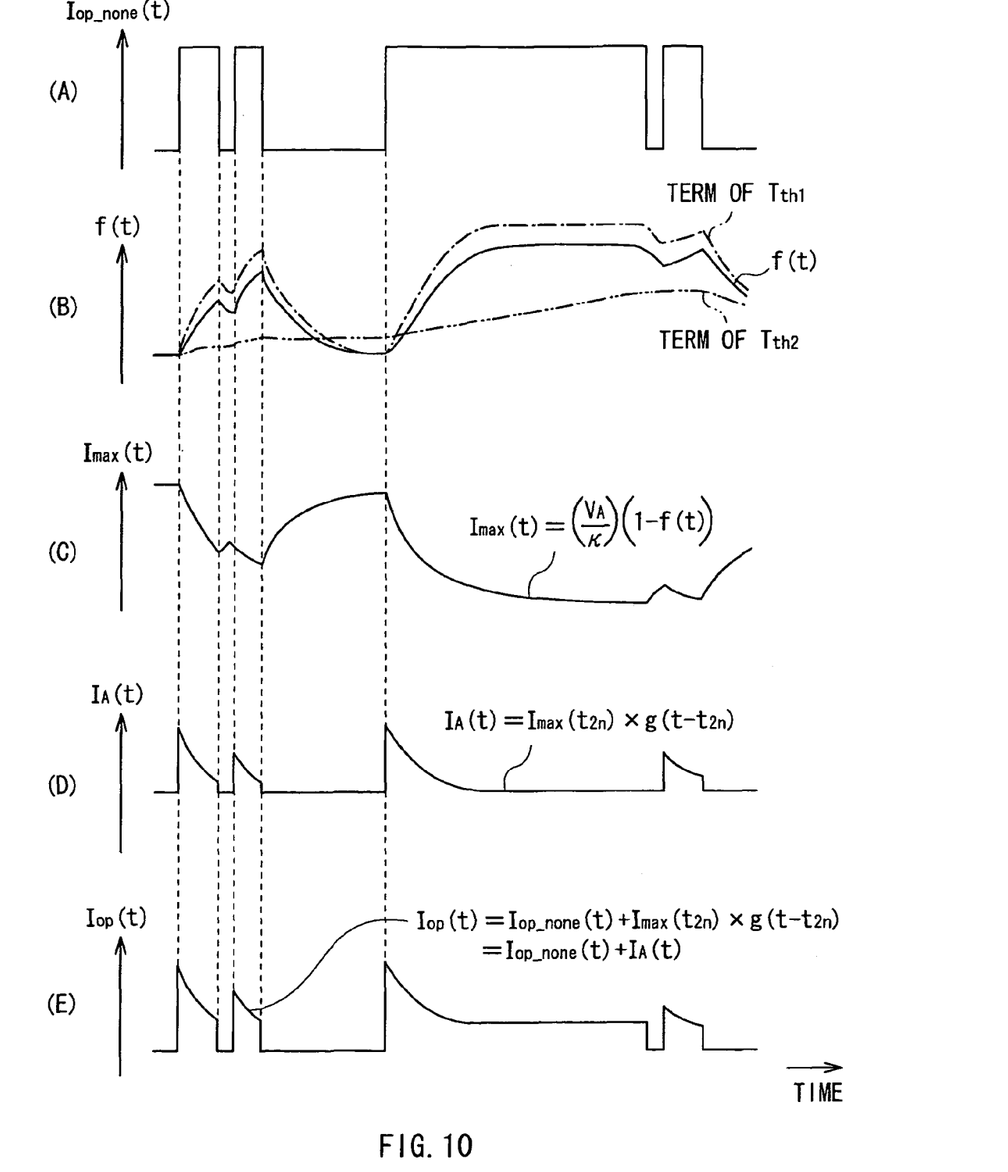
FIG. 10 is a waveform diagram for illustrating composition of an output waveform of a current source and an output waveform of a correction circuit in FIG. 2.

In the light emitting device 1 having such a configuration, the current source 21 outputs a rectangular current pulse (current $I_{op\text{-}none}(t)$) (part (A) in FIG. 10). At that time, the correction circuit 22 uses the RC time constant circuit 22A to derive g(t) defining a degree of attenuating the crest value of the current pulse (current $I_{op\text{-}none}(t)$) outputted from the current source 21 with time, f(t) representing variation in waveform in correspondence to variation in remaining heat factor in the semiconductor laser (in the active layer 53) (part (B) in FIG. 10), and $I_{max}(t)$ defining a maximum value of the assist current $I_A(t)$ (part (C) in FIG. 10). Next, the correction circuit 22 keeps a value of $I_{max}(t_{2n})$ at a start point ($t_{2n}$) of an on period when the semiconductor laser is operated by on/off drive, and besides derives an assist current $I_A(t)$ that attenuates the crest value according to g(t) with the value of $I_{max}(t_{2n})$ as a start point (part (D) in FIG. 10), and then the correction circuit outputs the assist current $I_A(t)$. Then, the laser drive circuit 20 applies a current pulse ($I_{op}(t) = I_{op\text{-}none}(t) + I_A(t)$), which is formed by superposing output of the current source 21 on output of the correction circuit 22, to the semiconductor laser 31 (part (E) in FIG. 10). Thus, the semiconductor laser 31 emits rectangular light, for example, as shown in FIG. 5B to the outside.

Principle

Next, the reason why the pulse waveform of light output of the semiconductor laser becomes approximately a rectangle in this way is described. FIG. 6 shows a thermal circuit of the semiconductor laser in the semiconductor laser device 31. Assuming that temperature of the substrate 51 is $T_0$, heat capacitance thereof is $C_{th}$, heat resistance thereof is $R_{th}$, temperature of the active layer 53 (active layer temperature) at an optional time t is $T_{act}(t)$, rise in element temperature due to bias current (<threshold current) is $T_b(t)$, injected energy is $P_{el}$, and light output is $P_{out}$, a heat equation for the active layer temperature $T_{act}(t)$ is expressed as the following numerical expressions 7 and 8. $R_{th}C_{th}$ denotes a thermal time constant.

$$T_{act}(t) - T_0 - (P_{el} - P_{opt})R_{th} = \qquad \text{[Numerical expression 7]}$$
$$-R_{th}C_{th}\frac{d}{dt}(T_{act}(t))$$

$$T_{act}(t) - T_0 - T_b = -R_{th}C_{th}\frac{d}{dt}(T_{act}(t)) \qquad \text{[Numerical expression 8]}$$

When the numerical expressions 7 and 8 are solved, the expressions may be modified into the following numerical expressions 9 and 10, respectively.

$$T_{act}(t) = \qquad \text{[Numerical expression 9]}$$
$$T_0 + (P_{el} - P_{opt})R_{th}\left\{1 - \exp\left[\frac{t - t_{2n} + \tau}{R_{th}C_{th}}\right]\right\}$$

$$T_{act}(t) = \qquad \text{[Numerical expression 10]}$$
$$T_0 + T_b + (T_{2n+1} - T_0 - T_b)\exp\left[-\frac{t - t_{2n+1}}{R_{th}C_{th}}\right]$$

Figure 7:
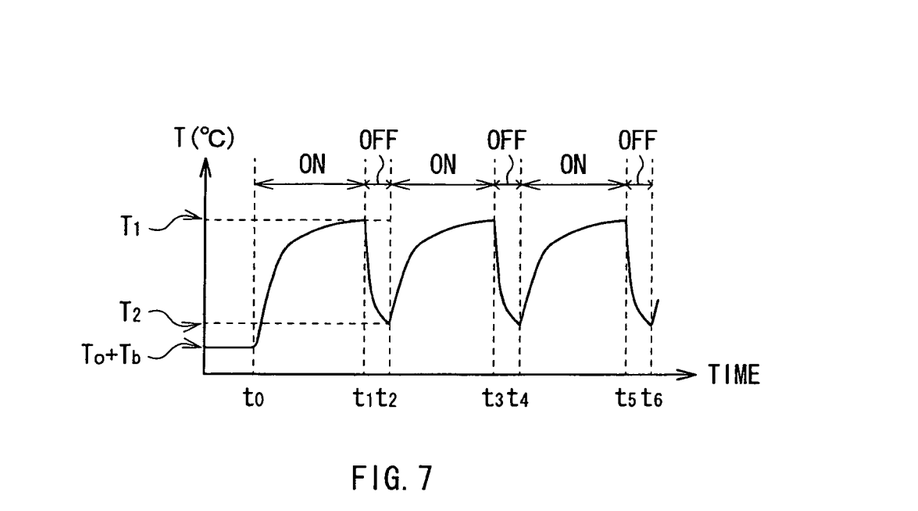
FIG. 7 is a waveform diagram for illustrating a variable in a thermal equation.
Figure 8A:
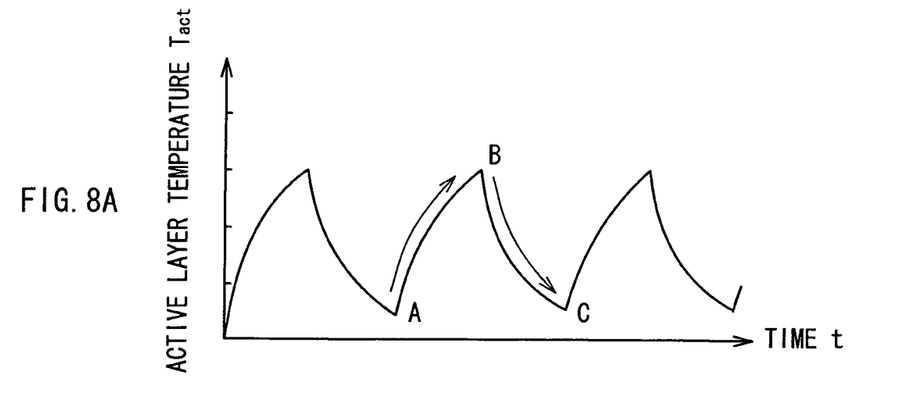
FIG. 8A shows temporal change in temperature of an active layer obtained by solving a thermal equation.

In the numerical expression 9, $t_{2n}$ (n is an integer of 0 or more) represents a start point of an on period when the semiconductor laser is operated by on/off drive as shown in FIG. 7. In the numerical expression 10, $t_{2n+1}$ represents a start point of an off period when the semiconductor laser is operated by on/off drive as shown in FIG. 7. In the numerical expression 9, τ is a coefficient for maintaining $T_{act}(t)$ in the numerical expression 9 and $T_{act}(t)$ in the numerical expression 10 to be continuous. When a value of the thermal time constant $R_{th}C_{th}$ is assumed to be 1 μsec, the numerical expressions 9 and 10 are represented by a graph as shown in FIG. 8A.

In the semiconductor laser, since cavity length is typically extremely short, about 1 to 2λ (λ is an oscillation wavelength), the oscillation wavelength is fixed by the cavity length. Therefore, the semiconductor laser may oscillate at a wavelength different from an emission wavelength (wavelength at which gain is maximized) of the active layer 53. Consequently, element temperature, at which a threshold current is minimized, may be optionally selected depending on design of wavelength detuning Δλ. Actually, the element temperature, at which a threshold current is minimized, has a value within a range of 0 to 60° C. both inclusive.

Figure 8B:
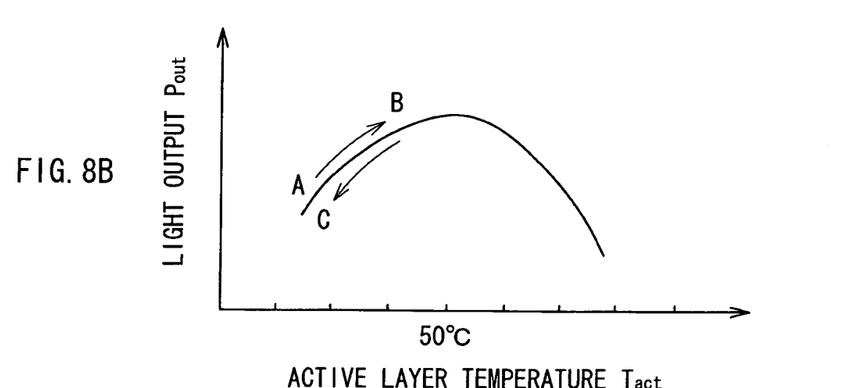
FIG. 8B shows a relationship between temperature of an active layer and light output obtained by actual measurement.
Figure 8C:
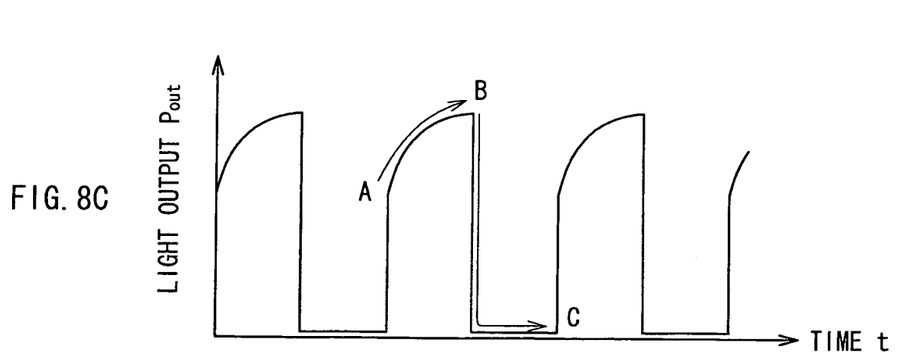
FIG. 8C shows temporal change in light output obtained from FIGS. 8A and 8B.

When sufficient light output is desirably obtained at a higher temperature, the wavelength detuning Δλ needs to be designed large. For example, in the semiconductor laser in a band of 660 to 680 nm having an active layer 53 including a red material (GaInP or AlGaInP), the wavelength detuning Δλ is designed to be about 19 nm, so that the threshold current is minimized at an element temperature $T_0$ of about 50° C. A threshold current has such temperature dependence, which means that light output at a constant current also has temperature dependence. For example, as shown in FIG. 8B, in the semiconductor laser designed with a wavelength detuning Δλ of 19 nm, light output is maximized at the element temperature $T_0$ of about 50° C., and is decreased as the element temperature $T_0$ becomes around 50° C. Thus, temporal change of light output may be drawn. As shown in FIGS. 8A to 8C, when light output is shifted from A to B, active layer temperature $T_{act}(t)$ is increased while light output $P_{out}$ is increased, and when light output is shifted from B to C during a current-off period, the active layer temperature $T_{act}(t)$ is decreased, and light output $P_{out}$ is decreased to zero at such shift timing.

Figure 9:
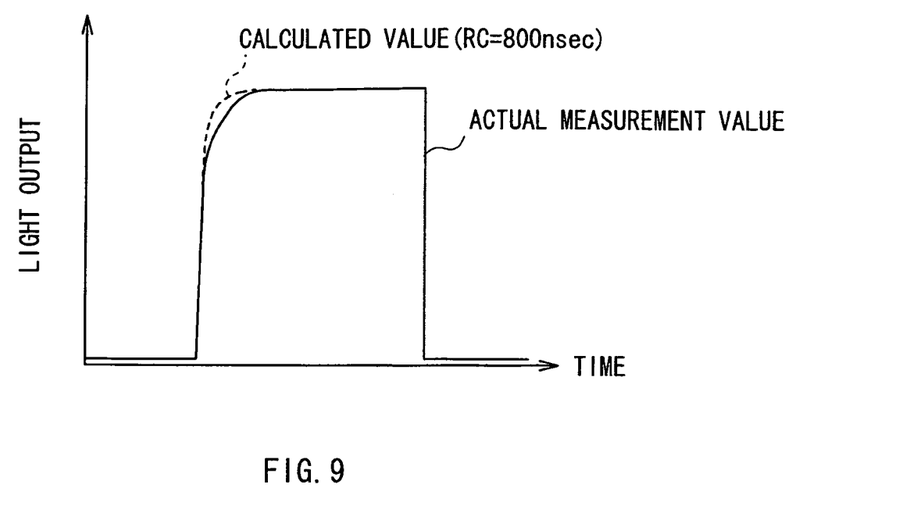
FIG. 9 is a diagram showing a measurement value of temporal change in light output and a calculated value thereof.

In this way, temporal change of light output $P_{out}$ may be derived from a thermal equation and dependence of the light output $P_{out}$ on active layer temperature. Thus, such a result (calculated value) is compared to a light waveform (measurement value) obtained from actual measurement, for example, as shown in FIG. 9. As a result, it is known that when the thermal time constant $R_{th}C_{th}$ is 800 nsec, the two agree with each other after rising of a pulse, namely, after several hundred nanoseconds from pulse start. However, it is also known that the two do not agree with each other during rising of a pulse. This reveals that the light output varies with the thermal time constant $R_{th}C_{th}$ having a value at least one order smaller than 800 nsec (approximately 20 to 50 nsec).

The reason why a light waveform has two time constants is likely to be because a heating condition of the semiconductor laser after rising of a pulse is different from that during rising of a pulse. The entire mesa of the semiconductor laser is likely to be heated after rising of a pulse, leading to increase in time constant. In contrast, the active layer is likely to be locally heated during rising of a pulse, leading to decrease in time constant. The thermal equation is given on the assumption that the entire mesa is heated, and therefore the equation does not sufficiently accurately express a light waveform during rising of a pulse.

Advantages

Thus, in the embodiment, the RC time constant circuit 22A in the correction circuit 22 has a plurality of time constant circuits having time constants different from one another (the second and third time constant circuits) as described before. Thus, a waveform of a current pulse outputted from the current source 21, which drives the semiconductor laser in a pulsed manner, may be corrected by using the correction circuit 22 including the RC time constant circuit 22A so that a pulse waveform of light output of the semiconductor laser is approximately a rectangle. In this way, in the embodiment, the RC time constant circuit 22A is used, so that the waveform of a current pulse outputted from the current source 21 may be shaped to be approximately a rectangle not only in a gradually sloped region after rising of a pulse, but also in an abruptly curved region during rising of a pulse. As a result, dullness of a light output waveform due to wavelength detuning Δλ may be reduced.

Moreover, in the embodiment, the correction circuit 22 operates such that a crest value of a current pulse outputted from the current source 21 varies in accordance with the factor $V_0$ determining the element temperature $T_0$ (ambient temperature). Thus, even if the wavelength detuning Δλ varies along with variation in ambient temperature (for example, temperature within a printer housing), dullness of a light output waveform may be reduced.

Moreover, in the embodiment, the correction circuit 22 operates such that a crest value of a current pulse outputted from the current source 21 varies in correspondence to variation in temperature of the active layer 53. Thus, even if the current source 21 continuously outputs current pulses, and thus a heat factor remains in the semiconductor laser (in the active layer 53), correction of the crest value of the relevant current pulse may be set to an appropriate value. As a result, even if the current source 21 continuously outputs current pulses, dullness of a light output waveform may be reduced.

Moreover, in the embodiment, the correction circuit 22 operates such that a value of the offset voltage $V_{offset}$ is adjusted, or a value of the constant κ for converting the assist current factor. $V_A$ into a current value is adjusted, thereby a crest value of a current pulse outputted from the current source 21 may be changed in accordance with magnitude of wavelength detuning Δλ. Which value should be adjusted between the two is preferably determined based on tendency of variation in light output to variation in temperature. For example, it is assumed that current narrowing diameter of the semiconductor laser becomes large compared with a desired value due to variation in manufacturing. In such a case, since variation in light output to variation in temperature is increased (that is, temperature dependence of light output is increased), the value of the constant κ is preferably adjusted. In contrast, for example, it is assumed that wavelength detuning Δλ of the semiconductor laser is increased due to variation in manufacturing. In such a case, since temperature, at which light output is maximized, is shifted to a higher temperature side (that is, temperature dependence of light output is shifted to a higher temperature side), the value of the offset voltage $V_{offset}$ is preferably adjusted. In this way, in the embodiment, since a preferable correction method may be selected based on tendency of variation in light output to variation in temperature, dullness of a light output waveform may be definitely reduced.

The present application contains subject matter related to that disclosed in Japanese Priority Patent Application JP 2009-221255 filed in the Japan Patent Office on Sep. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A correction circuit apparatus, comprising:
 a surface-emitting semiconductor laser;
 a current source operative for driving the surface-emitting semiconductor laser in a pulsed manner and having a current source output terminal for outputting a rectangular current pulse; and
 a correction circuit having a correction circuit output terminal connected to the current source output terminal and including a RC time constant circuit operative for outputting an assist current pulse having an initial peak value that attenuates over time,
 wherein the correction circuit in conjunction with the RC time constant circuit is operative to correct a waveform of the rectangular current pulse outputted from the current source output terminal of the current source by adding the assist current pulse thereto to form a resultant corrected current pulse so that a pulse waveform of light output of the semiconductor laser is approximately a rectangle,
 wherein both the rectangular current pulse and the assist current pulse commence at least substantially simultaneously at a time T1 and terminate at least substantially simultaneously at a later time T2,
 wherein the waveform of the rectangular current pulse is corrected so that a resultant initial peak value of the resultant corrected current pulse is attenuated with time in accordance with an RC time constant of the RC time constant circuit, the time being a period of time equal to time T2 minus time T1,
 wherein the RC time constant circuit includes a plurality of first time constant circuits attenuating the initial peak value of the current pulse with time,
  the first time constant circuits have RC time constants different from one another,
  at least one second time constant circuit of the plurality of first time constant circuits has an RC time constant having a value within a range of 20 nsec to 50 nsec both inclusive, and
  one or multiple third time constant circuits other than the second time constant circuit of the plurality of first time constant circuits have an RC time constant having a value of more than 50 nsec,
 wherein the semiconductor laser has a vertical resonator structure including an active layer sandwiched by a pair of multilayer reflectors and
 wherein the correction circuit corrects the waveform of the rectangular current pulse so that the initial peak value of the rectangular current pulse varies in correspondence to variation in temperature of the active layer.

2. The correction circuit apparatus according to claim 1,
 wherein the RC time constant circuit includes a plurality of fourth time constant circuits adjusting the initial peak value of the rectangular current pulse,
 the fourth time constant circuits have RC time constants different from one another,
 at least one fifth time constant circuit of the plurality of fourth time constant circuits has an RC time constant having a value within a range of 20 nsec to 50 nsec both inclusive, and
 one or multiple sixth time constant circuits other than the fifth time constant circuit of the plurality of fourth time constant circuits have an RC time constant having a value of more than 50 nsec.

3. The correction circuit apparatus according to claim 1,
 wherein the correction circuit changes the initial peak value of the rectangular current pulse depending on ambient temperature, bias current, or drive current.

4. The correction circuit apparatus according to claim 3,
 wherein the semiconductor laser has a vertical resonator structure including an active layer sandwiched by a pair of multilayer reflectors, and
 the correction circuit changes the initial peak value of the rectangular current pulse in accordance with magnitude of wavelength detuning as a difference between an emission wavelength of the active layer and an oscillation wavelength of the vertical resonator structure.

5. The correction circuit apparatus according to claim 3,
 wherein the correction circuit adjusts a value of a conversion constant for converting a voltage value into a current value, the voltage value having been set depending on ambient temperature, bias current, or drive current, so that the initial peak value of the current pulse is changed.

6. The correction circuit apparatus according to claim 1,
 wherein the active layer includes GaInP or AlGaInP, and
 wavelength detuning as a difference between an emission wavelength of the active layer and an oscillation wavelength of the vertical resonator structure is 15 nm or more.

7. The correction circuit apparatus according to claim 1, wherein the active layer includes GaAs or AlGaAs, and wavelength detuning as a difference between an emission wavelength of the active layer and an oscillation wavelength of the vertical resonator structure is 13 nm or more.

8. A drive circuit comprising:
a surface-emitting semiconductor laser,
a current source operative for driving the surface-emitting semiconductor laser in a pulsed manner and having a current source output terminal for outputting a rectangular current pulse; and
a correction circuit having output terminal connected to the current source output terminal and including a RC time constant circuit operative for outputting an assist current pulse having an initial peak value that attenuates over time, and using the RC time constant circuit to correct a waveform of the rectangular current pulse outputted from the current source,
wherein the correction circuit adds the assist current pulse to the rectangular current pulse to form a resultant corrected current pulse so that a pulse waveform of light output of the semiconductor laser is approximately a rectangle,
wherein both the rectangular current pulse and the assist current pulse commence at least substantially simultaneously at a time T1 and terminate at least substantially simultaneously at a later time T2,
wherein the waveform of the rectangular current pulse is corrected so that a resultant initial peak value of the resultant corrected current pulse is attenuated with time in accordance with an RC time constant of the RC time constant circuit, the time being a period of time equal to time T2 minus time T1,
wherein the RC time constant circuit includes a plurality of first time constant circuits attenuating the initial peak value of the current pulse with time,
the first time constant circuits have RC time constants different from one another,
at least one second time constant circuit of the plurality of first time constant circuits has an RC time constant having a value within a range of 20 nsec to 50 nsec both inclusive, and
one or multiple third time constant circuits other than the second time constant circuit of the plurality of first time constant circuits have an RC time constant having a value of more than 50 nsec,
wherein the semiconductor laser has a vertical resonator structure including an active layer sandwiched by a pair of multilayer reflectors and
wherein the correction circuit corrects the waveform of the rectangular current pulse so that the initial peak value of the rectangular current pulse varies in correspondence to variation in temperature of the active layer.

9. A light emitting device comprising:
one or multiple surface-emitting semiconductor lasers;
a current source operative for driving the surface-emitting semiconductor laser in a pulsed manner and having a current source output terminal for outputting a rectangular current pulse; and
a correction circuit having a correction circuit output terminal connected to the current source output terminal and including a RC time constant circuit operative for outputting an assist current pulse having an initial peak value that attenuates over time to correct a waveform of the rectangular current pulse outputted from the current source,
wherein the correction circuit adds the assist current pulse to the rectangular current pulse to form a resultant corrected current pulse so that a pulse waveform of light output of the semiconductor laser is approximately a rectangle,
wherein both the rectangular current pulse and the assist current pulse commence at least substantially simultaneously at a time T1 and terminate at least substantially simultaneously at a later time T2,
wherein the waveform of the rectangular current pulse is corrected so that a resultant initial peak value of the resultant corrected current pulse is attenuated with time in accordance with an RC time constant of the RC time constant circuit, the time being a period of time equal to time T2 minus time T1,
wherein the RC time constant circuit includes a plurality of first time constant circuits attenuating the initial peak value of the current pulse with time,
the first time constant circuits have RC time constants different from one another,
at least one second time constant circuit of the plurality of first time constant circuits has an RC time constant having a value within a range of 20 nsec to 50 nsec both inclusive, and
one or multiple third time constant circuits other than the second time constant circuit of the plurality of first time constant circuits have an RC time constant having a value of more than 50 nsec,
wherein the one or each one of multiple semiconductor lasers has a vertical resonator structure including an active layer sandwiched by a pair of multilayer reflectors and
wherein the correction circuit corrects the waveform of the rectangular current pulse so that the initial peak value of the rectangular current pulse varies in correspondence to variation in temperature of the active layer of the one or each one of multiple semiconductor lasers.

10. A method of correcting a current pulse waveform, comprising the steps of:
providing the surface-emitting semiconductor laser; and
using a correction circuit including an RC time constant circuit for outputting an assist current pulse having an initial peak value that attenuates over time, the correction circuit being used to correct a waveform of a rectangular current pulse outputted from a current source, the current source operative for driving the surface-emitting semiconductor laser in a pulsed manner, so that a pulse waveform of light output of the semiconductor laser is approximately a rectangle by adding the assist current pulse to the rectangular current pulse to form a resultant corrected current pulse,
wherein both the rectangular current pulse and the assist current pulse commence at least substantially simultaneously at a time T1 and terminate at least substantially simultaneously at a later time T2,
wherein the waveform of the rectangular current pulse is corrected so that a resultant initial peak value of the resultant corrected current pulse is attenuated with time in accordance with an RC time constant of the RC time constant circuit, the time being a period of time equal to time T2 minus time T1,
wherein the RC time constant circuit includes a plurality of first time constant circuits attenuating the initial peak value of the current pulse with time,
the first time constant circuits have RC time constants different from one another, at least one second time constant circuit of the plurality of first time constant circuits has an RC time constant having a value within a range of 20 nsec to 50 nsec both inclusive, and one or multiple third time constant circuits other than the second time constant circuit of the plurality of first time constant circuits have an RC time constant having a value of more than 50 nsec, wherein the semiconductor laser has a vertical resonator structure including an active layer sandwiched by a pair of multilayer reflectors and wherein the correction circuit corrects the waveform of the rectangular current pulse so that the initial peak value of the rectangular current pulse varies in correspondence to variation in temperature of the active layer.

11. A correction circuit apparatus according to claim 1, wherein, commencing at the initial peak value, the assist current pulse attenuates as a conventional exponential decay curve to and between time T1 and the later time T2.

12. A drive circuit according to claim 8, wherein, commencing at the initial peak value, the assist current pulse attenuates as a conventional exponential decay curve to and between time T1 and the later time T2.

13. A light emitting device according to claim 8, wherein, commencing at the initial peak value, the assist current pulse attenuates as a conventional exponential decay curve to and between time T1 and the later time T2.

14. A method of correcting a current pulse waveform according to claim 10, wherein, commencing at the initial peak value, the assist current pulse attenuates as a conventional exponential decay curve to and between time T1 and the later time T2.

15. The correction circuit apparatus according to claim 1, further comprising a temperature sensing device operative to sense the temperature of the active layer and provide electrical signals representative of the temperature of the active layer to the correction circuit.

16. The drive circuit according to claim 8, further comprising a temperature sensing device operative to sense the temperature of the active layer and provide electrical signals representative of the temperature of the active layer to the correction circuit.

17. The light emitting device according to claim 9, further comprising a temperature sensing device operative to sense the temperature of the active layer of the one or at least one of multiple surface-emitting semiconductor lasers and to provide electrical signals representative of the temperature of the active layer to the correction circuit.

18. The method according to claim 10, further comprising the step of providing a temperature sensing device operative to sense the temperature of the active layer and provide electrical signals representative of the temperature of the active layer to the correction circuit.

\* \* \* \* \*